United States Patent

Yam et al.

[11] Patent Number: 5,865,902
[45] Date of Patent: Feb. 2, 1999

[54] METHOD FOR CLEANING ELECTRONIC HARDWARE COMPONENTS

[75] Inventors: Benny S. Yam, Holmdel; Kenneth S. Colbert, Princeton Junction, both of N.J.

[73] Assignee: Church & Dwight Co., Inc., Princeton, N.J.

[21] Appl. No.: 710,058

[22] Filed: Sep. 10, 1996

Related U.S. Application Data

[60] Provisional application No. 60/017,088 May 9, 1996.

[51] Int. Cl.⁶ .................. B08B 7/00; B24D 3/00
[52] U.S. Cl. .................. 134/7; 134/6; 51/307; 51/309
[58] Field of Search ............... 134/7, 6; 51/307, 51/309

[56] References Cited

U.S. PATENT DOCUMENTS

| | | | |
|---|---|---|---|
| Re. 35,017 | 8/1995 | Winston et al. | 134/40 |
| 3,693,302 | 9/1972 | Hakes | 51/312 |
| 4,027,686 | 6/1977 | Shortes et al. | 134/33 |
| 4,631,250 | 12/1986 | Hayashi | 430/329 |
| 5,081,799 | 1/1992 | Kirschner et al. | 51/410 |
| 5,112,592 | 5/1992 | Kurtz | 423/419 R |
| 5,123,206 | 6/1992 | Woodson | 51/320 |
| 5,145,717 | 9/1992 | Drury | 427/96 |
| 5,160,547 | 11/1992 | Kirschner et al. | 134/7 |
| 5,232,514 | 8/1993 | Van Sciver et al. | 134/26 |
| 5,234,506 | 8/1993 | Winston et al. | 134/40 |
| 5,261,967 | 11/1993 | Winston et al. | 134/42 |
| 5,308,404 | 5/1994 | Yam et al. | 134/7 |
| 5,350,428 | 9/1994 | Leroux et al. | 29/25.01 |
| 5,376,157 | 12/1994 | Yam et al. | 51/307 |
| 5,384,990 | 1/1995 | Spears, Jr. | 451/38 |
| 5,411,750 | 5/1995 | Lajoie et al. | 424/717 |
| 5,505,749 | 4/1996 | Kirschner et al. | 51/309 |
| 5,575,705 | 11/1996 | Yam et al. | 451/39 |
| 5,588,901 | 12/1996 | Rubey, III et al. | 451/99 |

OTHER PUBLICATIONS

Catalog of the Aldrich Chemical Company, Aldrich Chemical Company, Inc., 1992, p. 1119.

*Primary Examiner*—Jill Warden
*Assistant Examiner*—Alexander Markoff
*Attorney, Agent, or Firm*—Irving Fishman

[57] ABSTRACT

A method and abrasive blast medium for cleaning contaminants from electronic hardware. The abrasive blast medium is a pure, water soluble alkaline salt of bicarbonates and carbonates. The particle size of the alkaline salts range from about 20 to no larger than about 300 microns in diameter. The Mohs hardness of the alkaline salt particles is no greater than about 5.0. The blast cleaning conditions employed to clean the electronic hardware are mild. Blast air pressures range from about 10 to about 50 psi and the medium flow rate ranges from about 1 to about 10 lbs/min.

23 Claims, 1 Drawing Sheet

METHOD FOR CLEANING ELECTRONIC HARDWARE COMPONENTS

The present application is a non-provisional application of U.S. provisional application Ser. No. 60/017,088, filed May 9, 1996.

BACKGROUND OF THE INVENTION

The present invention is directed to a method of blast cleaning electronic hardware components. More particularly, the method of the present invention is directed to cleaning electronic hardware components by blast cleaning with a water soluble abrasive media under mild conditions.

Electronic hardware components include any conductive, semiconductive or dielectric part used in electronic apparatus such as computers and the like. Such hardware components include, but are not limited to, electronic components of circuit and wiring boards, semiconductor wafers from which semiconductor chips are made, and disk drive heads and the like.

The cleanliness of electronic hardware components is regarded as being critical to their functional reliability. Contaminants on the electronic hardware components can cause shorts in the electronic hardware components and interfere with the operation of the electronic components such that the electrical functions of an electronic apparatus in which they are employed become unreliable.

In the manufacture of electronic hardware components, contaminants can accumulate after one or more steps of the manufacturing process as well as during the assembly of the components into an electronic apparatus. During the manufacturing process, electronic hardware components can be plated, etched, handled by operators during assembly steps, coated with corrosive or potentially corrosive fluxes and the like. Thus it is important that such contaminants be removed from the components. However, certain methods used to clean electronic hardware components can present undesirable problems of their own.

For example, in the fabrication of electronic circuit assemblies, e.g., printed circuit boards, soldering fluxes are first applied to the substrate board material to ensure firm, uniform bonding of the solder. These soldering fluxes fall into two broad categories: rosin and non-rosin, or water soluble, fluxes. The rosin fluxes which are generally only moderately corrosive and have a much longer history of use are still widely used throughout the electronics industry. The water soluble fluxes which are a more recent development are being used increasingly in consumer products applications. Because water soluble fluxes contain strong acids and/or amine hydrohalides, such fluxes are very corrosive. Unfortunately, residues of any flux can cause circuit failure if residual traces of the material are not carefully removed following soldering and thus remain on an electronic circuit assembly.

While water soluble fluxes can be easily removed with warm, soapy water, the removal of rosin flux from printed circuit boards is more difficult and has therefore traditionally been carried out with the use of chlorinated hydrocarbon solvents such as 1,1,1-trichloroethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and when released into the environment deplete the ozone layer and/or contribute to the greenhouse global warming effect. Thus, use of such solvents is subject to close scrutiny by the Occupational Safety and Health Administration (OSHA) and the Environmental Protection Agency (EPA), and stringent contaminant equipment must be used. Moreover, if released into the environment these solvents are not readily biodegradable and are thus hazardous for long periods of time.

Alkaline cleaning compounds known as the alkanolamines, usually in the form of monoethanolamine, have been used for rosin flux removal as an alternative to the toxic chlorinated hydrocarbon solvents. These high pH compounds (e.g., about pH 12), chemically react with rosin flux to form a rosin soap through the process of saponification. Other organic substances such as surfactants or alcohol derivatives can be added to these alkaline cleaning compounds to facilitate the removal of such rosin soap. Unfortunately, these compounds, as well as the water soluble soldering fluxes, have a tendency to cause corrosion on the surfaces and interfaces of printed wiring boards if such compounds and fluxes are not completely and rapidly removed during the fabrication process.

The complete removal of adhesive and other residues also pose a problem. During the manufacture of electronic circuit assemblies the components are mounted on the upper surface of the board with leads protruding downwardly through holes in the board and are secured to the bottom surface of the board by means of an adhesive. Further, it is sometimes necessary to temporarily protect certain portions of the circuit board by the application of special adhesive tape to susceptible areas. Once such protection is no longer needed, the adhesive tape must be removed. In both instances, a residue of adhesive generally remains which, if not thoroughly removed, can cause premature board failure. Removal of this adhesive residue has traditionally been carried out by the use of chlorinated solvents which, as already described, are toxic and environmentally undesirable.

In addition to soldering fluxes, any photoresist used in etching and screen printing of components on circuit and wiring boards can also cause short circuiting problems. U.S. Pat. No. 5,145,717 to Drury and assigned to E. I. Du Pont de Nemours and Company discloses a method of blast cleaning printed circuit boards of photoresist with an abrasive. The method employs polymeric or resin material having a Mohs scale hardness of about 2 to 4. The particles are accelerated at the surface of the board at an angle of about 15 to 90 degrees by means of a blasting apparatus to remove the photoresist. Although the method may remove photoresist from circuit and wiring boards, the polymer particles used to remove the photoresist can not be easily removed from the blasted surface. Moreover, the polymer particles can become embedded in the blast cleaned surface, or lodged in dead areas, i.e., corners or recesses of the surface, where it is very difficult to remove the polymer particles. Also, the photoresist can not be readily disposed of by sewering. Such particles would pollute the environment.

Similar contaminant problems also occur with disk drive heads. During assembly of computer terminals, such contaminants as adhesive and finger prints can contaminate the drive heads and result in compromised performance of the electronic apparatus.

As with the electronic components of circuit and wiring boards, and disk drive heads, it is important that semiconductor wafers and chips are as clean as possible before the semiconductor material is incorporated into any electronic apparatus. Any contaminants on the semiconductor material can jeopardize the optimum performance of the electronic apparatus. Consequently, such contaminants as oxidation compounds and laser slag formed on semiconductor wafers during manufacture preferably are removed prior to dicing or cutting the semiconductor wafers into semiconductor chips.

Blast cleaning of semiconductor wafer surfaces has been previously used to wash electrostatic particles from the surface. One such method utilizing water is disclosed in U.S. Pat. No. 4,027,686 to Shortes et al. and assigned to Texas Instruments, Inc. Other fluids, including air, have been used with varying degrees of success. Although various methods have been employed to clean contaminants from electronic hardware components, there is still a need for a mild and environmentally friendly method to clean such contaminants as photoresists, solder flux, adhesives, oxidized material, laser slag and the like from electronic hardware components.

It is known to blast clean soft surfaces of aluminum, magnesium, and plastic surfaces to remove paint and dirt with such abrasives as sodium chloride and sodium bicarbonate. However, in order to maintain the flow of such abrasives as sodium bicarbonate, flow aids such as hydrophobic silica are often employed. Such flow aids, however, can leave additional deposits on the surface of electronic components being cleaned. Such deposits when formed on electronic hardware components are not only difficult to remove even with high pressure water rinses, but replace one type of contaminant with another.

A primary object of the present invention is to provide a method of blast cleaning contaminants from electronic hardware components by blast cleaning the contaminants from the surface of electronic components under mild conditions.

Another object of the present invention is to blast clean the surface of electronic hardware components using relatively low pressures.

A further object of the present invention is to provide a method of blast cleaning contaminants from electronic components with environmentally friendly abrasives.

Still yet another object of the present invention is to blast clean electronic hardware components with a water soluble abrasive media.

Other objects and advantages of the present invention will become apparent to those of skill in the art upon reading the description of the present invention which follows and practicing the present invention.

SUMMARY OF THE INVENTION

The present invention is directed to a method of blast cleaning electronic hardware components of contaminants such as photoresists, solder flux, adhesives, oxidized metals and the like. In the electronics industry, it is important that such electronic components as semiconductors, conductors and dielectric components such as circuit boards and wiring boards remain as free of contaminants as possible to permit optimum performance of the electronic components. Such contaminants as solder flux, photoresists, oxidized metal on electronic components and even finger prints can lead to short circuiting or interference in the electrical signals throughout an electronic apparatus.

Advantageously, the method of the present invention cleans electronic hardware components of contaminants such as photoresists, solder flux, adhesives, oxidized metal and the like by blast cleaning the electronic components using mild blast cleaning conditions such as relatively low pressures, and employing such environmentally friendly, water soluble abrasives such as carbonate and bicarbonate alkaline salts. Preferably the alkaline salts employed are pure, and are packaged in vacuum pack containers made of or lined with plastic material such as Mylar® to prevent the alkaline salts from picking up moisture, and to prevent contamination from hydrocarbon sources which may leach from polyethylene, polypropylene or other polyolefin containers or liners. It is also important that the package in which the abrasive medium is stored is free of sliping agents. Sliping agents are oily, light hydrocarbon material used in many plastic packages to prevent the sides of the packages from adhering together.

The water soluble blast cleaning compositions of the present invention are characterized by non-corrosiveness as well as low environmental impact, unlike the chlorinated hydrocarbon solvents and highly alkaline cleaners that have heretofore been employed for cleaning printed wiring and circuit boards. Additionally, the blast cleaning compositions of the present invention preferably avoid the use of flow aids which are generally insoluble in water, and which can cause the formation of difficult to remove deposits on the electronic components.

Advantageously, the electronic hardware component cleaning compositions, as used herein, are water soluble, and can readily be rinsed off from the electronic hardware components. Also, because the blast cleaning media used in the method of the present invention can readily be rinsed off a component being cleaned, the blast media can be easily removed from dead areas. Such electronic hardware cleaning compositions are also environmentally friendly, and the rinse water can be sewered without further treatment thus eliminating the need for costly water treatment methods.

DETAILED DESCRIPTION OF THE INVENTION

Figure 1:
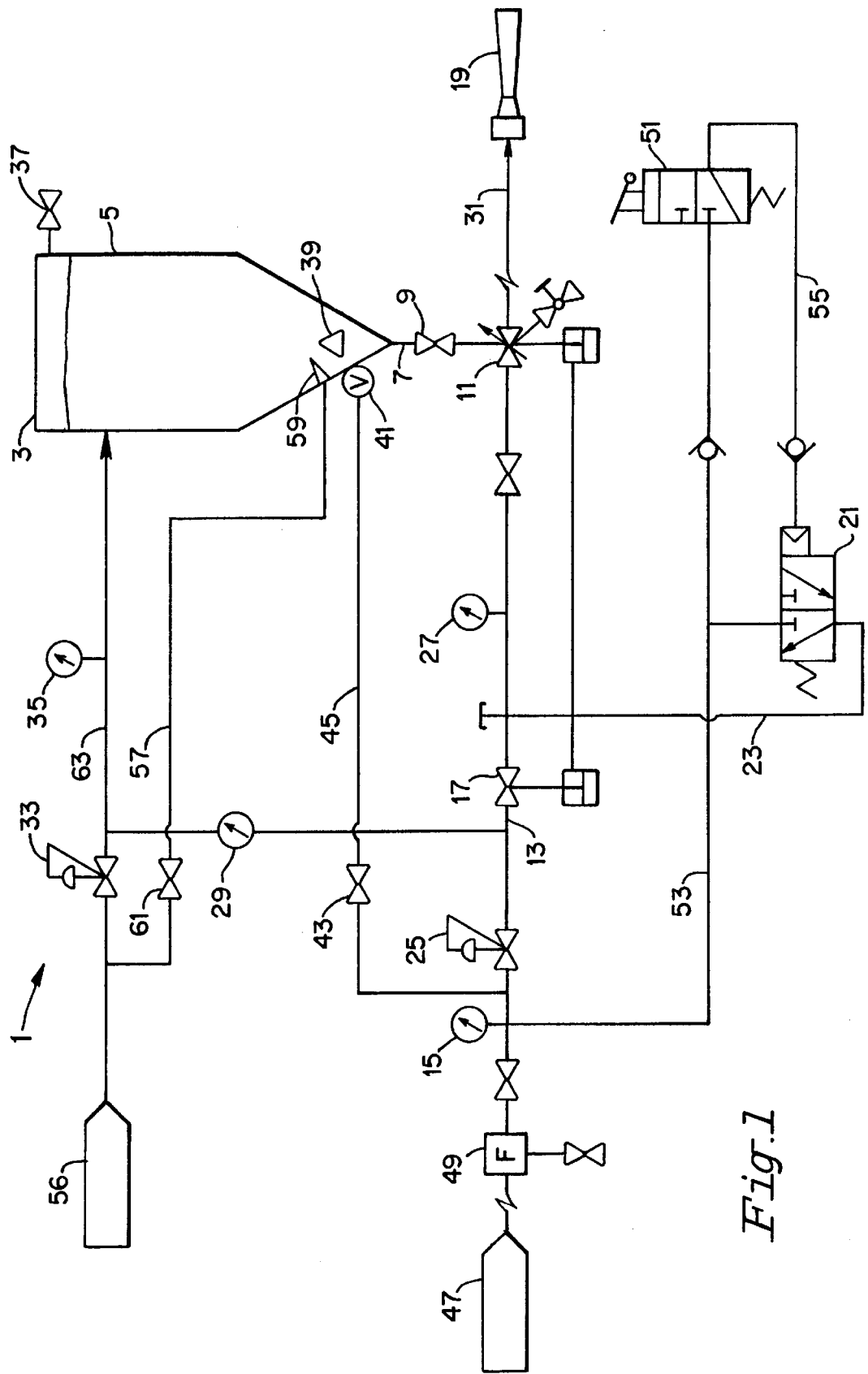
FIG. 1 illustrates a blasting apparatus which can be employed to practice the method of the present invention.

The present invention is directed to a method of blast cleaning contaminants from electronic hardware components used in electronic apparatus under relatively mild conditions with a pure, water soluble, alkaline salt abrasive medium. Pure within the context of the present invention means that the alkaline salt abrasive medium is about 99.0 wt. % to about 100 wt. % free of unwanted contaminants.

Electronic hardware components which can be cleaned with the method of the present invention include, but are not limited to, conductive materials such as the conductive components found on circuit and wiring boards, semiconductive components such as semiconductor wafers, semiconductor chips and disk drive heads and the like. In addition, the method of the present invention can clean hardware components such as formed from dielectric compositions as plastic or glass which are formed into circuit and wiring boards and the like.

Examples of contaminants found on electronic hardware components, especially during the manufacture of electronic hardware components include, but are not limited to, photoresists, solder fluxes, adhesives, oxidized compounds as well as laser slag formed during the manufacture of electronic wafers.

It is important in the electronics industry to maintain the electronic hardware components of electronic apparatus as clean as possible to allow for the optimum performance and operation of the electronic components and the electronic apparatus. Contamination of the electronic components can lead to shorts in the circuitry compromising the performance of the electronic apparatus.

Electronic hardware components are cleaned with the method of the present invention by directing a stream of abrasive material at the electronic components at an effective acceleration to remove the contaminants from the electronic components. Acceleration can be accomplished by any suitable media propelling or projecting means. The media can be propelled or projected in a gaseous or liquid fluid such as air or water or it can be projected by some other suitable mechanical means. Preferably, dry blasting with pressurized air is used to accelerate and direct the media using a pneumatic blasting apparatus, or similar device. The media also can be accelerated as a watery slurry or dispersion and projected as a stream onto the electronic component or the media can be injected into a projected water stream.

Preferably, the media propelling means will have a moveable media outlet, such as a nozzle, which allows the media to be directed over the surface of the electronic hardware component being cleaned. The electronic hardware component can be moved past one or more fixed nozzles through the utilization of a conveyor or any suitable fixture device. The electronic components pass under the nozzles until all sides of the components are clean. The number of passes under the nozzle or nozzles can vary and can range from about 1 to 50 passes on each side of the component. About 10 to 30 passes under the nozzle or nozzles for each side of the electronic component is optimal for many electronic components.

To achieve effective cleaning of an electronic component, the blast air pressure is about 10 to about 50 psi, preferably about 10 to about 30 psi, and most preferably about 20 psi. The media flow rate is from about 1 to about 10 lbs/min, preferably about 2 to about 8 lbs/min, and most preferably, about 4 to about 6 lbs/min at the nozzle.

Further, to assure a uniform and continuous flow of abrasive media from the source or storage container of the abrasive media to the means for transporting the media to the nozzle, a differential pressure of between about 1 psi to about 10 psi, preferably about 4 to 6 psi, is maintained between the media source and the media transporting means. As the media flow leaves the nozzle, it is projected as a cone with the nozzle at the apex and the electronic component to be cleaned at the base. By changing the distance between the electronic hardware component being cleaned and the nozzle, the actual media flow pressure projecting onto the component being cleaned can be adjusted to suit the specific type of component. Nozzle to target distances can range from about 0.5 inch to about 20 inches, preferably about 10 inches, to effectively clean an electronic component. The orientation of the path of the media can markedly affect the extent of the removal of the contaminants from the surface of the electronic components being cleaned without damage to the more sensitive components. An optimal path of media flow will be one in which the angle and direction of the media flow produces efficient removal of contaminants without damage to the component. Effective removal of contaminants from the surface of electronic components can be at angles of the nozzle to the surface of the electronic component to be cleaned at from about 10 to about 50 degrees, preferably about 15 to about 30 degrees.

After the electronic hardware components are cleaned, the components are rinsed with deionized water to wash away any abrasive material left on the components. The components are then dried by any suitable method employed in the art.

As discussed above, any suitable blasting apparatus can be employed to blast clean an electronic component by the method of the present invention. Preferably, the apparatus employed in the method of the present invention is the Accustrip® supply system which is the subject matter of U.S. Pat. No. 5,081,799, assigned to Church & Dwight, the entire disclosure of which is hereby incorporated herein in its entirety by reference. A particularly preferred apparatus for blast cleaning the electronic components is a modification of the Accustrip® supply system. Such modifications include a media level sensor near the bottom of the pressure pot containing the blast media. The modifications also include vibrators on the side of the pressure pot to help move the flow of blast media through the pot, and a "Chinese" cone or hat located near the bottom of the pot to permit free flow of the blast media through the pot without channeling problems. A further modification includes pressurizing the pot with nitrogen gas by means of a source of inert nitrogen gas and a nitrogen aerator near the bottom of the pot. Such modifications in the Accustrip® system improve the blast media flow during the cleaning process. FIG. 1 is a schematic of the modified Accustrip® supply system employed in the method of the present invention.

Referring to FIG. 1, blast apparatus 1 includes a blast pot 3, partially filled with blast media 5. The blast pot 3, suitably having a cavity of about 1 cubic foot, terminates in a media exit line 7 governed by a valve 11. The amount of media passing through the media exit line 7 is monitored by media level sensor 9 near the bottom of the Pot 3. The blast pot comprises a vent valve 37 to release any pressure in the pot after blast cleaning. A "Chinese" cone or hat 39 near the bottom of the pot allows the efficient flow of blast media through the pot to the media exit line 7 without unwanted channeling of the blast media. A vibrator 41 attached to the pot and controlled by a vibrator adjuster 43 through line 45 causes the pot to vibrate during blast cleaning to cause the media to move down the pot to the media exit line 7. The pot contains a media level sensor (not shown) for gauging the amount of media left in the pot. The media valve 11 restricts the flow of the media 5 to the desired flow rate. A line 13 is connected to a source of pressurized air 47 which is monitored with an inlet gauge 15. The air is filtered by air filter 49. Air valve 17 is a remotely operated on/off valve that activates the air flow to nozzle 19 and the opening and closing of the media cut off valve. The nozzle is operated by an on/off valve 51 via line 53 and connected to the control valve 21 by line 55. Nozzle pressure regulator valve 25 regulates the nozzle pressure by means of a gauge 27 when the system is in operation. Nozzle pressure regulator valve 25 can maintain the desired nozzle pressure. The nozzle pressure gauge 27 enables a controlled pressure to be applied to the nozzle 19. The differential pressure gauge 29 monitors the pressure between the blast pot 3 and the conveying hose 31. The pot pressure regulator 33, measured by gauge 35, is used to provide a pressure higher than the pressure in the conveying hose 31 by means of line 63, thus allowing the differential pressure to be monitored by differential pressure gauge 29. The media pot is pressurized with nitrogen gas from a nitrogen source 56. The nitrogen gas passes through line 57 to a nitrogen aerator 59 at the bottom of pot. The amount of nitrogen passing into the pot is regulated by nitrogen gas adjuster 61. Optional equipment for protection of and cooling of the workpiece and control of dust can be provided by a water injection line (not shown) which injects water to the nozzle 19.

The blast media employed in the method of the present invention are water soluble or at least water dispersable.

Non-limiting examples of water soluble blast media which can be utilized include the alkaline metal salts such as the carbonates, bicarbonates and mixtures thereof. The preferred blast media are the sodium and potassium carbonates and bicarbonates or mixtures thereof. Also useful are sodium sesquicarbonate and natural sodium sesquicarbonate known as trona. It is important to note that by water soluble it is not meant to mean completely water soluble as some salts and natural minerals such as trona can contain minor amounts of insoluble materials. For example, trona which is a natural sodium sesquicarbonate can contain up to 10 wt. % of insolubles. Thus water soluble is meant to include those materials which are substantially soluble in water.

In addition to the abrasive being water soluble or water dispersable, the abrasive employed to practice the present invention has a very fine particle size with an average particle size of at least about 20 microns but not more than about 300 microns, and a Mohs hardness of no greater than about 5.0. Particles larger than about 300 microns are preferably not employed because such particles can damage the electronic hardware components being blast cleaned. Although particles with a size of about 20 microns can be employed to practice the present invention, particles having sizes of less than about 30 microns do not flow well and can cause flow related problems during cleaning operations. Thus, preferably the particles employed to practice the present invention are not smaller than about 30 microns. Most preferably, the average particle size ranges from about 50 to about 150 microns.

A most preferred example of blast media used to clean the electronic hardware components contains sodium bicarbonate which is about 99.0 wt. % to about 100 wt. % pure. The particle size distribution of the sodium bicarbonate employed in the blast media includes a maximum of about 7 wt. % of particles that remain on a 140 mesh screen; a maximum of about 52 wt. % of particles that will remain on a 200 mesh screen; a minimum of about 80 wt. % of particles that will remain on a 325 mesh screen; and a minimum of about 95 wt. % of particles that will remain on a 400 mesh screen. The chloride ion content of the blast media is no more than about 100 ppm, preferably no more than about 50 ppm. The chemical oxygen demand (COD) content is no more than about 100 ppm. The carbonate ($CO_3^{2-}$) content is no more than about 0.20 wt. %, preferably no more than about 0.10 wt. %. The moisture content of the sodium bicarbonate medium is no more than about 0.20 wt. %, preferably no more than about 0.10 wt. % moisture. Such a pure form of sodium bicarbonate minimizes flow related problems during blast cleaning.

Adjuvants such as flow aids such as hydrophilic silica, hydrophobic silica, hydrophobic polysiloxane and the like which are commonly employed in certain blast media as a decaking agent are avoided in the blast media of the present invention. Such flow aids can cause the formation of difficult to remove deposits on many electronic hardware components. Such deposits can not easily be removed by either high pressure cleaning methods or water rinses.

The blast media employed in the method of the present invention can be packaged in any suitable container which is free of organic sliping agents and keeps the blast media essentially free of moisture, such as a moisture barrier polymer bag. Moisture and organic sliping agents can cause undesirable agglomeration of abrasive media. Agglomerated blast media do not flow well during blast cleaning and can block the lines of a blast cleaning apparatus. Thus, it is important that the packaging provides an essentially moisture free environment for the abrasive media to maintain a free flowing media.

Preferably, the preferred sodium bicarbonate blast media is packaged under a vacuum or nitrogen or carbon dioxide purge in a plastic or foil bag. Polyethyleneterephthalate or Mylar® is the preferred material to use to package the sodium bicarbonate. The sodium bicarbonate is packaged in amounts of about 20 lbs to about 50 lbs in each bag and placed in a rigid, non-collapsable container such as a plastic pail or rigid cardboard box. Such containers keep the sodium bicarbonate blast media moisture free and compression free such that the media does not agglomerate or clump during storage prior to arriving at the blast site.

What is claimed is:

1. A blast medium for cleaning electronic hardware comprising water soluble alkaline metal salt abrasive particles having a particle size of at least about 20 microns but not more than about 300 microns and a Mohs hardness of no greater than about 5.0, a chloride ion content of no more than about 100 ppm, a chemical oxygen demand of no more than about 100 ppm, and a moisture content of no more than about 0.20 wt. %, said blast medium is free of silica and organic containing flow aids.

2. The blast medium of claim 1, wherein the alkaline metal salt abrasive particles comprise potassium or sodium salts of carbonates or bicarbonates or mixtures thereof.

3. The blast medium of claim 2, wherein the alkaline metal salt abrasive particles comprises sodium bicarbonate.

4. The blast medium of claim 3, wherein the sodium bicarbonate is about 99.0 wt. % to about 100 wt. % pure.

5. The blast medium of claim 1, wherein the abrasive particles have a moisture content of no more than about 0.10 wt. %.

6. The blast medium of claim 4, wherein the carbonate ($CO_3^{-2}$) content of the blast medium is no more than about 0.20 wt. %.

7. The blast medium of claim 4, wherein the sodium bicarbonate comprises particles having a size distribution of a maximum of about 7 wt. % of particles that remain on a 140 mesh screen; a maximum of about 52 wt. % of particles that remain on a 200 mesh screen; a minimum of about 80 wt. % of particles that remain on a 325 mesh screen; and a minimum of about 95 wt. % of particles that remain on a 400 mesh screen.

8. A packaged, free flowing blast medium for cleaning electronic hardware, said blast medium comprising water soluble alkaline metal salt abrasive particles having a particle size of at least about 20 microns but no more than about 300 microns and a Mohs hardness of no greater than about 5.0, a chloride ion content of no more than about 100 ppm and a moisture content of no more than 0.20 wt. %, said blast medium being stored in a polymer bag without an organic sliping agent, said polymer bag preventing said alkaline metal salt particles from gaining additional moisture to prevent the particles from agglomerating during storage.

9. The packaged, free flowing blast medium of claim 8, wherein the moisture content is no more than about 0.10 wt. %.

10. The packaged, free flowing blast medium of claim 8, wherein the polymer bag is composed of polyethyleneterephthalate.

11. The packaged, free flowing blast medium of claim 8, wherein the alkaline metal salt particles are stored in the polymer bag in amounts of from about 20 to about 50 lbs.

12. The packaged, free flowing blast medium of claim 11, wherein the polymer bag containing the alkaline metal salt particles is stored in a rigid container to keep the blast medium compression free.

13. The packaged, free flowing blast medium of claim 8, wherein the blast medium is free of silica and organic containing flow aids.

14. A method of blast cleaning electronic hardware to remove contaminants from the electronic hardware comprising: propelling an abrasive blast medium against a surface of the electronic hardware by means of a pressurized fluid stream, the blast medium comprising particles of a pure, water soluble alkaline metal salt, wherein the particles have an average diameter of at least about 20 microns but not more than about 300 microns, a Mohs hardness of not greater than about 5.0, a chloride ion content of no more than about 100 ppm, a chemical oxygen demand of no more than 100 ppm, and a moisture content of no more than about 0.20 wt. %, said blast medium is free of silica and organic containing flow aids.

15. The method of claim 14, further comprising mixing the abrasive blast medium with water and propelling the abrasive blast medium against the surface of the electronic hardware as a watery slurry or dispersion.

16. The method of claim 14, wherein the fluid stream comprises air or water.

17. The method of claim 16, wherein the air is at a pressure of from about 10 to about 50 psi.

18. The method of claim 14, wherein a medium flow rate is from about 1 to about 10 lbs/min.

19. The method of claim 14, wherein the alkaline metal salt comprises sodium or potassium salts of carbonate or bicarbonate or mixtures thereof.

20. The method of claim 19, wherein the alkaline salt comprises about 99.0 wt. % to about 100 wt. % sodium bicarbonate.

21. The method of claim 20, wherein the blast medium contains no more than about 0.2 wt. % carbonate ($CO_3^{2-}$) content.

22. The method of claim 20, wherein the sodium bicarbonate comprises particles having a size distribution of a maximum of about 7 wt. % of particles that remain on a 140 mesh screen; a maximum of about 52 wt. % of particles that remain on a 200 mesh screen; a minimum of about 80 wt. % of particles that remain on a 325 mesh screen; and a minimum of about 95 wt. % of particles that remain on a 400 mesh screen.

23. The method of claim 14, wherein the moisture content of the particles is no more than about 0.10 wt. %.

* * * * *